(12) United States Patent
Park et al.

(10) Patent No.: US 10,795,230 B2
(45) Date of Patent: *Oct. 6, 2020

(54) FLEXIBLE DISPLAY DEVICE WHICH CAN BE FOLDED OR ROLLED

(71) Applicant: Samsung Display Co., Ltd., Yongin-si (KR)

(72) Inventors: Jong Ryuk Park, Yongin-si (KR); Jin Wook Seo, Yongin-si (KR); Sung Young Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/561,487

(22) Filed: Sep. 5, 2019

(65) Prior Publication Data

US 2020/0004091 A1  Jan. 2, 2020

Related U.S. Application Data

(63) Continuation of application No. 15/630,108, filed on Jun. 22, 2017, now Pat. No. 10,451,940.

(30) Foreign Application Priority Data

Nov. 11, 2016 (KR) .......................... 10-2016-0150058

(51) Int. Cl.
*G02F 1/1362* (2006.01)
*G09G 3/32* (2016.01)
(Continued)

(52) U.S. Cl.
CPC ......... *G02F 1/136227* (2013.01); *G09G 3/32* (2013.01); *H01L 27/32* (2013.01);
(Continued)

(58) Field of Classification Search
CPC ... G09G 3/32–3258; G09G 2300/0421; G09G 2300/0426; G09G 2300/0439;
(Continued)

(56) References Cited

U.S. PATENT DOCUMENTS

| 6,307,611 | B1 | 10/2001 | Kim et al. |
| 7,619,258 | B2 | 11/2009 | Tsuchiya et al. |

(Continued)

FOREIGN PATENT DOCUMENTS

| JP | 2005-302707 A | 10/2005 |
| JP | 2007-302707 | 10/2005 |

(Continued)

OTHER PUBLICATIONS

Non-Final Office Action dated Sep. 28, 2018, issued in U.S. Appl. No. 15/630,108.

(Continued)

*Primary Examiner* — Nathan Danielsen
(74) *Attorney, Agent, or Firm* — H.C. Park & Associates, PLC (57) ABSTRACT

A display device including a substrate having a display area to display an image and a non-display area, at least one pixel provided on the substrate, a first insulating layer provided on the substrate, and including a first opening at a area adjacent to the display area, a second insulating layer provided on the first insulating layer, and including a second opening at the area adjacent to the display area, and an encapsulation layer covering the first opening, the second opening, and a portion of the non-display area. The pixel includes a first electrode provided on the first insulating layer, and a second electrode provided on the second insulating layer. At least one of the first electrode and the second electrode includes a metal layer. At least one of sides of the first opening includes a plurality of slopes having different inclinations.

17 Claims, 6 Drawing Sheets

(51) Int. Cl.
*H01L 51/52* (2006.01)
*H01L 27/32* (2006.01)
*H01L 51/00* (2006.01)
*H01L 51/50* (2006.01)
*G02F 1/03* (2006.01)
*G02F 1/1333* (2006.01)

(52) U.S. Cl.
CPC ...... *H01L 51/0097* (2013.01); *H01L 51/5048* (2013.01); *H01L 51/5237* (2013.01); *H01L 51/5253* (2013.01); *G02F 1/0316* (2013.01); *G02F 1/133305* (2013.01); *H01L 2251/5338* (2013.01); *Y02E 10/549* (2013.01)

(58) Field of Classification Search
CPC ..... G09G 2300/046; G09G 2300/0465; G09G 2310/0281; G09G 2380/02; G02F 1/015; G02F 1/0316; G02F 1/133305; G02F 1/136227; H01L 51/5048; H01L 51/5237; G06F 3/041; G06F 3/0412; G06F 3/044; G06F 2203/04103; G06F 2203/04111; G06F 2203/04112
See application file for complete search history.

(56) References Cited

U.S. PATENT DOCUMENTS

| | | | |
|---|---|---|---|
| 7,944,140 B2 | 5/2011 | Kwak et al. | |
| 8,080,936 B2 | 12/2011 | Fujimura et al. | |
| 8,159,127 B2 | 4/2012 | Izumi | |
| 8,193,699 B2 | 6/2012 | Fujioka et al. | |
| 8,933,454 B2 | 1/2015 | Kim et al. | |
| 9,246,130 B2 | 1/2016 | Furuie | |
| 9,293,738 B2 | 3/2016 | Park et al. | |
| 9,508,782 B2 | 11/2016 | Park et al. | |
| 9,773,853 B2 | 9/2017 | Tao et al. | |
| 9,818,807 B2 | 11/2017 | Park | |
| 9,923,167 B2 | 3/2018 | Choi et al. | |
| 2005/0218396 A1* | 10/2005 | Tsuchiya ............ H01L 27/3246 257/13 |
| 2009/0250701 A1 | 10/2009 | Kimura et al. | |
| 2010/0295759 A1 | 11/2010 | Tanaka et al. | |
| 2011/0272816 A1 | 11/2011 | Sasagawa et al. | |
| 2014/0049500 A1 | 2/2014 | Chen et al. | |
| 2015/0036081 A1 | 2/2015 | Beon et al. | |
| 2015/0185942 A1 | 7/2015 | Kim et al. | |
| 2015/0207100 A1 | 7/2015 | Saito et al. | |
| 2016/0351093 A1 | 12/2016 | Kim et al. | |

FOREIGN PATENT DOCUMENTS

| | | |
|---|---|---|
| JP | 2006-054111 | 2/2006 |
| JP | 2014-5424738 | 1/2011 |
| JP | 2014-5424738 B2 | 1/2011 |
| JP | 4678421 | 4/2011 |
| JP | 2015-049946 | 3/2015 |
| KR | 10-0647702 B1 | 11/2006 |
| KR | 10-0786294 | 12/2007 |
| KR | 10-0830331 | 5/2008 |
| KR | 10-2013-0131701 | 12/2013 |
| KR | 10-2015-0014656 A | 2/2015 |
| KR | 10-2015-0033444 A | 4/2015 |
| KR | 10-2016-0045392 | 4/2016 |
| KR | 10-2016-0087982 | 7/2016 |
| KR | 10-2016-0108800 | 9/2016 |

OTHER PUBLICATIONS

Non-Final Office Action dated Feb. 26, 2019, issued in U.S. Appl. No. 15/630,108.
Notice of Allowability dated Jun. 5, 2019, issued in U.S. Appl. No. 15/630,108.

* cited by examiner

FLEXIBLE DISPLAY DEVICE WHICH CAN BE FOLDED OR ROLLED

CROSS-REFERENCE TO RELATED APPLICATION

This application is a Continuation of U.S. patent application Ser. No. 15/630,108, filed on Jun. 22, 2017, and claims priority from and the benefit of Korean Patent Application No. 10-2016-0150058, filed on Nov. 11, 2016, both of which are hereby incorporated by reference for all purposes as if fully set forth herein.

BACKGROUND

Field

The invention relates generally to a display device, and, more particularly, to a display device capable of flexing, folding and/or rolling.

Discussion of the Background

Recently, flexible display devices having flat panel displays are being developed. Representative examples of a flat panel display may include a liquid crystal display (LCD), an organic light-emitting diode (OLED), an electrophoretic display (EPD), and the like. Bendable and flexible display devices may be folded and rolled. Consequently, the flexible display devices are able to include larger screens while remaining portable. Such flexible display devices may be applied in various fields including not only mobile devices such as a mobile phone, a portable multimedia player (PMP), a navigation device, an ultra mobile PC (UMPC), an electronic book, and an electronic newspaper, but also a TV, a monitor, and so forth.

The above information disclosed in this Background section is only for enhancement of understanding of the background of the inventive concepts, and, therefore, it may contain information that does not form the prior art that is already known in this country to a person of ordinary skill in the art.

SUMMARY

Display devices constructed according to the principles of the invention reduce or prevent defects in or damage to an encapsulation layer stacked on an insulating layer of the device. For example, the process of etching a metal layer while manufacturing a display device can create a vortex which, after the etchant is removed, results in the deposit of some of the etched metal in the location of an encapsulation layer of the device that has a relatively low elasticity. When the display device is subsequently pressed, e.g., during a subsequent step in the process of manufacturing the display device, force is applied to the encapsulation layer. This force can damage the encapsulation layer stacked on an insulating layer due to the presence of the deposited etched metal next to the encapsulation layer.

Additional aspects will be set forth in the detailed description which follows, and, in part, will be apparent from the disclosure, or may be learned by practice of the inventive concepts.

According to one aspect of the invention, a display device includes a substrate including a display area to display an image, and a non-display area provided on at least one side of the display area, at least one pixel provided on the substrate, a first insulating layer provided on the substrate, and including a first opening at an area adjacent to the display area, a second insulating layer provided on the first insulating layer, and including a second opening at the area adjacent to the display area, and an encapsulation layer covering the first opening, the second opening, and a portion of the non-display area, wherein the pixel includes a first electrode provided on the first insulating layer and a second electrode provided on the second insulating layer, and at least one of the first electrode and the second electrode includes a metal layer, and wherein at least one of sides of the first opening comprises a plurality of slopes having different inclinations.

The side of the first opening may include a first slope having a first inclination, a second slope having a second inclination different from the first inclination, and a third slope having a third inclination different from the second inclination.

The second inclination may be greater than the first inclination or the third inclination.

The second insulating layer may cover the first slope, the second slope, and the third slope.

The first opening and the second opening may extend along the boundary between the display area and the non-display area of the substrate.

The non-display area may include one side thereof a bent area having flexibility.

The bent area may be bendable at a radius of curvature of about 4.5 mm or less.

The first insulating layer and the second insulating layer may be provided in the bent area.

The non-display area may be provided along a perimeter of the display area.

The encapsulation layer may include a first inorganic insulating layer, an organic insulating layer, and a second inorganic insulating layer that are successively stacked.

The first inorganic insulating layer and the second inorganic insulating layer may be provided over the first opening and the second opening.

Each of the first insulating layer and the second insulating layer may include organic insulating material.

The substrate may have flexibility.

According to another aspect of the invention, a display device includes a substrate including a display area to display an image, and a non-display area provided on at least one side of the display area, at least one pixel provided on the substrate, a first insulating layer provided on the substrate, and including a first opening at an area adjacent to the display area, a second insulating layer provided on the first insulating layer, and including a second opening at the area adjacent to the display area, and an encapsulation layer covering the first opening, the second opening, and a portion of the non-display area, wherein the pixel comprises a first electrode provided on the first insulating layer, and a second electrode provided on the second insulating layer, and at least one of the first electrode and the second electrode includes a metal layer, and wherein the second insulating layer covers at least one side of the first opening.

At least one of sides of the first opening may include a plurality of slopes having different inclinations.

The second insulating layer may cover a side of the first opening that is adjacent to the display area.

The first insulating layer may have two parts with a distance therebetween and a distance between an edge of the first insulating layer and an edge of the second insulating layer opposite to the edge of the first insulating layer may be less than the distance between the two parts of the first insulating layer.

The distance between the two parts of the first insulating layer and the distance between the first insulating layer and the second insulating layer may be within a range in which metal particles deposited on the at least one of the sides of the first opening do not damage the encapsulating layer.

The first insulating layer may have two parts with a distance therebetween and a distance between an edge of the first insulating layer and an edge of the second insulating layer opposite to the edge of the first insulating layer may be less than the distance between the two parts of the first insulating layer.

The distance between the two parts of the first insulating layer and the distance between the first insulating layer and the second insulating layer are within a range in which metal particles deposited on a side of the first opening do not damage the encapsulating layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
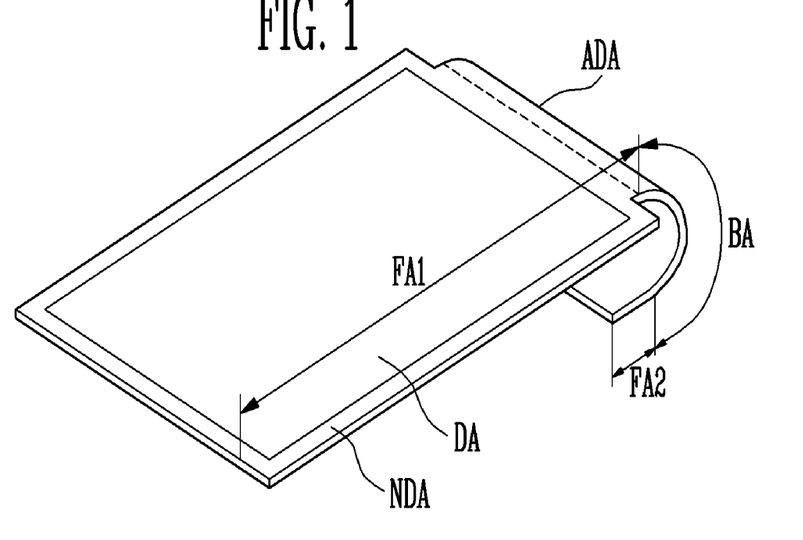
FIG. 1 is a perspective view of a display device constructed in accordance with the principles of the invention.
Figure 2:
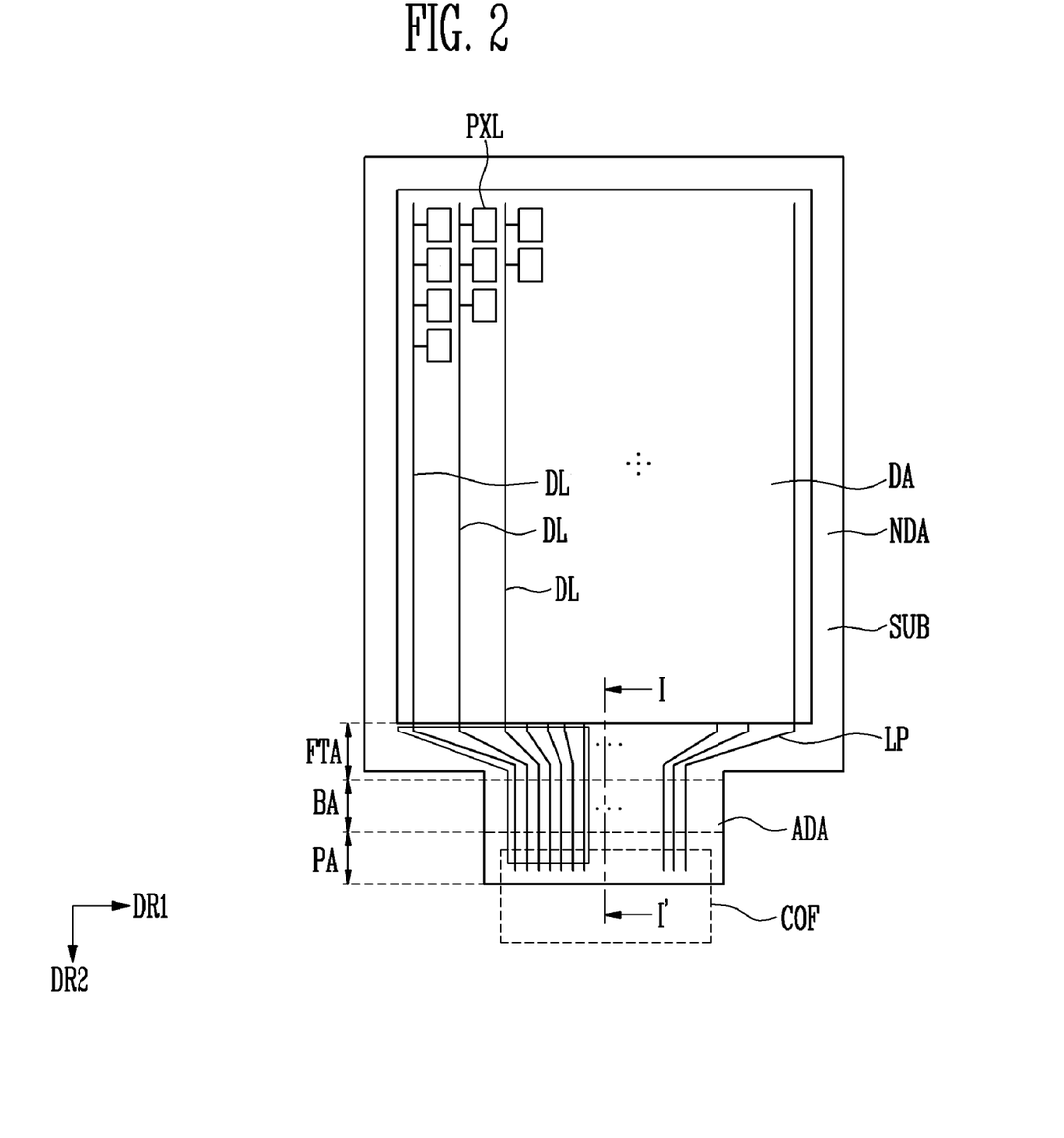
FIG. 2 is a plan view of the display device of FIG. 1.

Referring to FIGS. 1 and 2, the display device includes a substrate SUB, pixels PXL provided on the substrate SUB, and a line part LP coupled with the pixels PXL.

The substrate SUB includes a display area DA, and a non-display area NDA provided on at least one side of the display area DA.

The substrate SUB may have an approximately quadrangular shape, particularly, a rectangular shape. The substrate SUB may include a pair of short sides which are parallel to a first direction DR1, and a pair of long sides which are parallel to a second direction DR2. In the illustrated embodiment, the four sides of the substrate SUB may be referred to in sequence as first side S1 to fourth side S4, with the first and third sides being the short sides and second and fourth sides being the long sides.

However, the shape of the substrate SUB is not limited to such a rectangular shape, but may have various shapes. For example, the substrate SUB may be provided in shapes such as a closed polygon including linear sides, a circle, an ellipse or the like including a side formed of a curved line, and a semicircle, a semi-ellipse or some other shape including sides formed of a straight line and a curved line, and so forth. When the substrate SUB has a side formed of a straight line, at least some of corners of each shape may be formed of a curved line. For instance, when the substrate SUB has a rectangular shape, each of the junctions between adjacent linear sides is replaced with a curved line having a predetermined curvature. That is, each of the vertices of the rectangular substrate SUB may be formed of a curved side, which has a predetermined curvature, and opposite ends of which are respectively coupled to two adjacent linear lines. The curvature may vary depending on the position. For example, the curvature may vary depending on a start point of the curved line, the length of the curved line, and so on.

The display area DA is an area which is provided with a plurality of pixels PXL, and on which an image is displayed. The display area DA may be provided with a shape corresponding to the shape of the substrate SUB. For example, in the same manner as the shape of the substrate SUB, the display area DA may be provided in various shapes such as a closed polygon including linear sides, a circle, an ellipse or the like including a side formed of a curved line, and a semicircle, a semi-ellipse or the like including sides formed of a straight line and a curved line, and so forth. When the display area DA has a side formed of a straight line, at least some of the corners of each shape may be formed of a curved line.

The pixels PXL are provided on the display area DA of the substrate SUB. Each pixel PXL refers to the smallest unit displaying an image, and a plurality of pixels may be provided. The pixels PXL may emit white light and/or colored light. Each pixel PXL may emit any one color of red, green and blue, but it is not limited to this structure, and the pixel PXL may emit a color such as cyan, magenta, or yellow.

Each of the pixels PXL may be a light-emitting element including an organic emission layer, but it is not limited to this structure, but the pixel PXL may be embodied in various forms such as a liquid crystal element, an electrophoretic element, and an electrowetting element.

The non-display area NDA may further include an additional area ADA which protrudes from a portion thereof. The additional area ADA may protrude from the sides that define the non-display area NDA. As shown, the additional area ADA protrudes from a side corresponding to one of the short sides of the substrate SUB. However, the additional area ADA may protrude from one of the long sides or be provided in the form in which it protrudes from each of two or more sides. A data drive unit may be provided on or coupled to the additional area ADA, but it is not limited to this structure, and various components may be disposed on the additional area ADA.

At least portion of the display device may have flexibility, and the display device may be folded at any flexible portion thereof. That is, the display device may include a bent area BA which has flexibility and is folded in one direction, and a flat area FA which extends beyond at least one side of the bent area BA and is flat without folding. The flat area FA may have flexibility or might not.

As shown, the bent area BA is provided in the additional area ADA. There may be provided a first flat area FA1 and a second flat area FA2 that are spaced apart from each other with the bent area BA interposed therebetween. The first flat area FA1 may include the display area DA. The bent area BA may be spaced apart from the display area DA.

With regard to the bent area BA, a line about which the display device is folded refers to a folding line, and the folding line is provided in the bent area BA. In this regard, the term "fold" means that the display device may be changed from the original shape thereof to another shape without being fixed in shape, and has various meanings including being "folded" or "curved" along the folding line, or being "rolled" in a scrolling manner or otherwise flexed. Therefore, the two flat areas FA1 and FA2 are disposed such that one side of one flat area may be parallel with one side of the other flat area, and the display device is folded such that the flat areas FA1 and FA2 face each other. However, the two flat areas FA1 and FA2 with the bent area BA interposed therebetween may be folded onto each other with a predetermined angle therebetween (e.g., an acute angle, right angle or obtuse angle), or in some other orientation.

The additional area ADA may be bent later along the folding line. In this case, since the additional area ADA is bent, the width of a bezel may be reduced.

Figure 3:
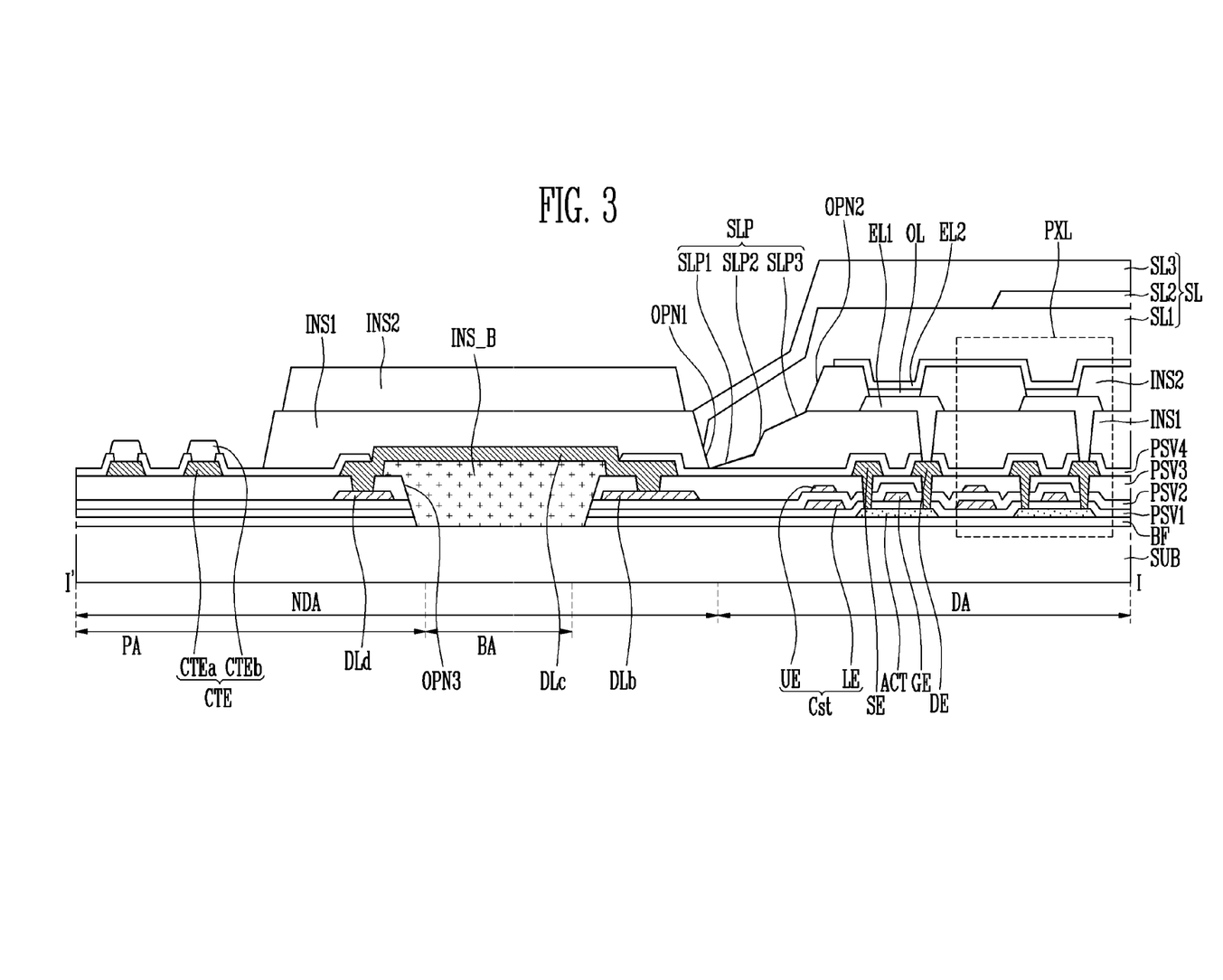
FIG. 3 is a cross-sectional view taken along line I-I' of FIG. 2 illustrates a boundary portion between the display area and a non-display area including a first opening in an insulating layer having sloped sides.

Referring to FIG. 3, the display area DA will be first described, and then the non-display area NDA will be described.

A plurality of pixels PXL are provided in the display area DA. Each pixel PXL includes a transistor that is coupled to a corresponding line of the line part LP, a light emitting element that is coupled to the transistor, and a capacitor Cst. The transistor may include or constitute a drive transistor for controlling the light emitting element, and a switching transistor for switching the drive transistor.

The pixels PXL are provided on the substrate SUB.

The substrate SUB may be made of insulating material such as glass or resin. Furthermore, the substrate SUB may be made of material having flexibility so as to be bendable or foldable. Consequently, not only the bent area BA provided on the non-display area NDA of the substrate SUB but also the other areas of the substrate SUB may also be bendable or foldable. For example, the display area DA on which the pixels PXL are provided may be flexed, bent or folded. Furthermore, the substrate SUB may have a single layer or multilayer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be changed in various ways, and the substrate SUB may also be made of fiber reinforce plastic (FRP) or the like.

A buffer layer BF is formed on the substrate SUB. The buffer layer BF functions to prevent impurities from diffusing into the switching transistor or the drive transistor. The buffer layer BF may be provided in a single layer structure or a multilayer structure having at least two or more layers.

The buffer layer BF may be an inorganic insulating layer formed of inorganic material. For example, the buffer layer BF may be formed of silicon nitride, silicon oxide, silicon oxynitride, or the like. In the case where the buffer layer BF has a multilayer structure, the respective layers may be formed of the same material or different materials. The buffer layer BF may be omitted depending on the material of the substrate SUB or processing conditions.

Active patterns ACT are provided on the buffer layer BF. Each active pattern ACT is formed of a semiconductor material. Each active pattern ACT may include a source region, a drain region, and a channel region provided between the source region and the drain region. The active pattern ACT may be a semiconductor pattern formed of polysilicon, amorphous silicon, an oxide semiconductor, or some other material. The channel region may be a semiconductor pattern undoped with impurities and an intrinsic semiconductor. Each of the source region and the drain region may be a semiconductor pattern doped with an impurity. An impurity such as an n-type impurity, a p-type impurity or other metals may be used as the doping impurity.

A first passivation layer PSV1 is provided on the active pattern ACT. The first passivation layer PSV1 may be an inorganic insulating layer formed of inorganic material, or an organic insulating layer formed of organic material. Inorganic insulating materials such as polysiloxane, silicon nitride, silicon oxide, or silicon oxynitride may be used as the inorganic insulating material. The organic insulating material may be a material such as a polyacryl-based compound, a polyimide-based compound, a fluorocarbon compound such as Teflon, or a benzocyclobutene compound.

A gate electrode GE and a lower capacitor electrode LE are provided on the first passivation layer PSV1. The gate electrode GE is formed to cover a region corresponding to the channel region of the active pattern ACT.

The gate electrode GE and the lower capacitor electrode LE may be made of metal. For example, the gate electrode GE may be made of at least one of metals such as gold (Au), silver (Ag), aluminum (Al), molybdenum (Mo), chrome (Cr), titanium (Ti), nickel (Ni), neodymium (Nd), copper (Cu), or an alloy of these metals. The gate electrode GE may have a single layer structure, but it is not limited to this structure, and may have a multilayer structure formed by stacking two or more materials of metals and alloys.

Other lines including gate lines may be provided in the same layer as that of the gate electrode GE and the lower capacitor electrode LE and formed of the same material as these electrodes. Other lines such as the gate lines may be directly or indirectly coupled to a portion of the transistor, e.g., the gate electrode GE, in each pixel PXL.

A second passivation layer PSV2 is provided on the gate electrode GE and the lower capacitor electrode LE. The second passivation layer PSV2 may be an inorganic insulating layer formed of an inorganic material. Polysiloxane, silicon nitride, silicon oxide, silicon oxynitride, or the like may be used as the inorganic material.

An upper capacitor electrode UE is provided on the second passivation layer PSV2. The upper capacitor electrode UE may be formed of metal. For example, the upper capacitor electrode UE may be made of at least one of metals such as gold (Au), silver (Ag), aluminum (Al), molybdenum (Mo), chrome (Cr), titanium (Ti), nickel (Ni), neodymium (Nd), copper (Cu), or an alloy of these metals. The upper capacitor electrode UE may have a single layer structure, but it is not limited to this structure, and it may have a multilayer structure formed by stacking two or more materials of the metals and alloys.

The lower capacitor electrode LE and the upper capacitor electrode UE are provided with the second passivation layer PSV2 therebetween, thus forming the capacitor Cst. The capacitor Cst may be formed of the lower capacitor electrode LE and the upper capacitor electrode UE, but the capacitor Cst is not limited to this orientation. The capacitor Cst may be embodied in various other manners.

A third passivation layer PSV3 is provided on the upper capacitor electrode UE. The third passivation layer PSV3 may be an inorganic insulating layer formed of an inorganic material. Polysiloxane, silicon nitride, silicon oxide, silicon oxynitride, or the like may be used as the inorganic material.

A source electrode SE and a drain electrode DE are provided on the third passivation layer PSV3. The source electrode SE and the drain electrode DE respectively come into contact with the source region and the drain region of the active pattern ACT through contact holes that are formed in the third passivation layer PSV3, the second passivation layer PSV2 and the first passivation layer PSV1.

The source electrode SE and the drain electrode DE may be made of metal. For example, each of the source electrode SE and the drain electrode DE may be made of at least one of metals such as gold (Au), silver (Ag), aluminum (Al), molybdenum (Mo), chrome (Cr), titanium (Ti), nickel (Ni), neodymium (Nd), copper (Cu), or an alloy of these metals. Each of the source electrode SE and the drain electrode DE may have a single layer structure, but they are not limited to this structure, and they may have a multilayer structure formed by stacking two or more materials of metals and alloys.

Data lines DL or first power lines may be provided in the same layer as that of the source electrode SE and the drain electrode DE and formed of the same material as them. The data lines DL or the first power lines may be directly or indirectly coupled to a portion, e.g., the source electrode SE and/or the drain electrode DE, of the transistor in each pixel PXL.

A fourth passivation layer PSV4 may be provided on the source electrode SE and the drain electrode DE. The fourth passivation layer PSV4 may be an inorganic insulating layer formed of an inorganic material. Polysiloxane, silicon nitride, silicon oxide, silicon oxynitride, or the like may be used as the inorganic material. The fourth passivation layer PSV4 may be omitted.

A first insulating layer INS1 may be provided on the fourth passivation layer PSV4. In the case where the fourth passivation layer PSV4 is omitted, the first insulating layer INS1 may be provided on the third passivation layer PSV3.

At least one pixel PXL is provided on the substrate SUB. Each pixel may have a first electrode EL1 provided between the first insulating layer INS1 and a second insulating layer INS2, and a second electrode EL2 provided on the second insulating layer INS2. A metal layer may be provided in at least one of the first electrode EL1 and the second electrode EL2. The first electrode EL1 and the second electrode EL2 may be an anode and a cathode, respectively.

The first electrode EL1 may be formed of a metal layer made of Ag, Mg, Al, Pt, Pd, Au, Ni, Nd, Ir, Cr, or an alloy of these metals, and/or ITO (indium tin oxide), IZO (indium zinc oxide), ZnO (zinc oxide), ITZO (indium tin zinc oxide), or the like.

The first electrode EL1 may be formed of one kind of metal, but it is not limited to this structure, and it may be formed of two or more kinds of metals, for example, as an alloy of Ag and Mg.

The first electrode EL1 may be formed of a transparent conductive layer when desired to provide an image in a direction toward a lower portion of the substrate SUB, or may be formed of a metal reflective layer and/or a transparent conductive layer when desired to provide an image in a direction toward an upper portion of the substrate SUB.

The second insulating layer INS2 for defining a pixel (PXL) region corresponding to each pixel PXL is provided on the substrate SUB on which the first electrode EL1, etc. are formed. The second insulating layer INS2 may be an organic insulating layer made of an organic material. An organic insulating material such as a polyacryl-based compound, a polyimide-based compound, a fluorocarbon compound such as Teflon, or a benzocyclobutene compound may be used as the organic material.

The second insulating layer INS2 exposes an upper surface of the first electrode EL1 and protrudes from the substrate SUB along the periphery of the pixel PXL.

The first insulating layer INS1 and the second insulating layer INS2 are successively stacked on the substrate SUB. Each of the first insulating layer INS1 and the second insulating layer INS2 may be an organic insulating layer made of organic material. In FIG. 3, the display device has only two insulating layers. However, the display device may further have an insulating layer disposed between the first insulating layer INS1 and the second insulating layer INS2, under the first insulating layer, and/or on the second insulating layer INS2.

Still referring to FIG. 3, the first insulating layer INS1 has a first opening OPN1, and the second insulating layer INS2 has a second opening OPN2. The first opening OPN1 and the second opening OPN2 may be provided at an area adjacent to the display area. The above area where the first opening OPN1 and the second opening OPN2 may be provided at can be a boundary between the display area DA and the non-display area NDA. Therefore, the first insulating layer INS1 and the second insulating layer INS2 might not be provided at the boundary between the display area DA and the non-display area NDA. Due to the presence of the first and second openings OPN1 and OPN2, there might be no organic insulating layer at the boundary between the display area DA and the non-display area NDA. The organic insulating layer may be a path along which external oxygen or water penetrates the display device. In the illustrated embodiment of FIG. 3, there is no organic insulating layer in the first and second openings OPN1 and OPN2. An encapsulation layer is stacked on the first and second openings OPN1 and OPN2. As a result, external oxygen or water may be prevented from penetrating the display device through the organic insulating layer. Each of the first opening OPN1 and the second opening OPN2 may have a sufficiently large width so that residual material does not remain in the opening during the process of forming the first insulating layer INS1 or the second insulating layer INS2.

One side of the first opening OPN1 may include a plurality of slopes SLP having different inclinations. The slopes SLP may be formed on the side of the first opening OPN1 that is adjacent to, at or in the display area. Referring to FIG. 3, the slopes SLP include a first slope SLP1, a second slope SLP2 and a third slope SLP3.

The display device may include the slopes SLP on at least one of sides of the first opening OPN1 so as to prevent metal particles from being deposited on one side of the first opening OPN1.

The metal layer included in the first electrode EL1 or the second electrode EL2 is etched by an etchant during the process of forming the first electrode EL1 or the second electrode EL2. The etched metal is present in the etchant in the form of metal ions. When the metal ions in the etchant come into contact with another metal, the metal ions may receive electrons and be extracted from the etchant. The extraction of metal depends on the ionization tendency of metal. For example, a first metal (M1) included in the first electrode EL1 or the second electrode EL2 may be present in the form of first metal ions (M1$^+$) by etching. When the first metal ions (M1$^+$) in an etchant come into contact with a second metal (M2), the first metal ions (M1$^+$) may be extracted in the form of first metal (M1), and the second metal (M2) may be ionized in the form of second metal ions (M2$^+$), as shown in the following chemical formula.

$$a\mathrm{M1}^{c+} + b\mathrm{M2} \rightarrow a\mathrm{M1}(\downarrow) + b\mathrm{M2}^{d+}$$ [Chemical formula 1]

(a, b, c, d are arbitrary natural numbers)

In the above-described case, the ionization tendency of the second metal (M2) is greater than that of the first metal (M1). After extraction, when the first metal (M1) floating in the etchant is deposited on a certain region in the display device, a problem may be caused by the first metal (M1). For example, in the case where particles of the first metal (M1) are deposited on one side of the first opening OPN1, the deposited particles of the first metal (M1) may damage an encapsulation layer SL formed on the first insulating layer INS1. In detail, particles of the first metal (M1) that are deposited on one side of the first opening OPN1 may damage encapsulation layers SL1 and SL3 each having relatively low elasticity, when the display device is pressed during the process of manufacturing the display device.

Particles of the first metal (M1) which may cause such a problem may be deposited on one side of the first opening OPN1, in particular, on a side thereof adjacent to the bent area BA. In the case where the first insulating layer INS1 has a stepped portion with a steep slope on a side of the first opening OPN1, a vortex of etchant may be generated on a distal end of the first insulating layer INS1 or one side of the first opening OPN1. Particles of the first metal (M1) floating in the etchant may accumulate in a region where the vortex is generated. The particles of the first metal (M1) may be deposited on the region where the vortex is generated, after the etchant has been removed.

According to the principles of the invention, particles of the first metal (M1) may be prevented from being deposited on a side of the first opening OPN1. In detail, because the slopes SLP are included in at least one of the sides of the first opening OPN1, a vortex of etchant is prevented from being formed on a side of the first opening OPN1. Consequently, the particles of the first metal (M1) floating in the etchant are not deposited on a side of the first opening OPN1 and, moreover, subsequent damage to the encapsulation layer SL formed on the first opening OPN1 does not occur, e.g., during the subsequent step(s) of pressing that transmit force to the encapsulation layer SL.

The first metal may be, for example, silver (Ag). Therefore, silver (Ag) particles may be prevented from being deposited on one side of the first opening OPN1. Silver (Ag) may be included in the display device. Since silver (Ag) is material having high electrical conductivity, the silver (Ag) may be used as material of electrodes or power lines in the display device. Silver (Ag) included in electrodes or power lines may be melted into an etchant in the form of silver ions (Ag⁺) during an etching process. Such silver ions (Ag⁺) may receive electrons and be extracted to form silver (Ag) again during the process of manufacturing the display device. For example, when the etchant including silver ions (Ag⁺) comes into contact with aluminum (Al), electrons may move from the aluminum (Al) to the silver ions (Ag⁺), whereby silver (Ag) may be extracted. During the process of manufacturing the display device, it is difficult to avoid the etchant including silver ions (Ag⁺) from coming into contact with another metal. Therefore, in many cases, the silver ions (Ag⁺) and the resulting extracted silver (Ag) are present in the etchant.

The first insulating layer INS1 and the second insulating layer INS2 may be successively stacked and form a dam. The first opening OPN1 and the second opening OPN2 may be formed between the bent area BA and the dam. Therefore, the slopes SLP may be provided on a side of the first insulating layer INS1 stacked on the bent area BA, or on a side of the first insulating layer INS1 forming the dam. However, the positions of the first insulating layer INS1, the first opening OPN1 and the slopes SLP are not limited to these configurations. For example, the first opening OPN1 may be provided between a region in which the dam is provided and a region in which the first electrode EL1 is provided. Alternatively, in the case where a dam is not provided in the display device, the first opening OPN1 may be provided between the bent area BA and the region in which the first electrode EL1 is provided. Depending on the position in which the first opening OPN1 is provided, the positions at which the slopes SLP are provided may also be changed.

An organic light-emitting layer OL may be provided on the pixel (PXL) region enclosed by the second insulating layer INS2.

The organic light-emitting layer OL may include low-molecular or high-molecular material. The low-molecular material may include copper phthalocyanine (CuPc), N,N'-Di(naphthalene-1-yl)-N,N'-diphenyl-benzidine (NPB), tris-8-hydroxyquinoline aluminum (Alq3), etc. Such materials may be formed by a vacuum evaporation method. The high-molecular material may include PEDOT, PPV (polyphenylenevinylene)-based material, polyfluorene-based material, or some other material.

The organic light-emitting layer OL may have a single-layer structure, or a multilayer structure including various functional layers. When the organic light-emitting layer OL has a multilayer structure, it may have a structure in which a hole injection layer, a hole transport layer, an emission layer, an electron transport layer, an electron injection layer, and so on, are stacked in a single-material or multi-material structure. The organic light-emitting layer OL may be formed by an evaporation method, a screen printing method, an inkjet printing method, a laser induced thermal imaging (LITI) method, or the like.

The structure of the organic light-emitting layer OL is not limited to the foregoing, and it may have various other structures. At least a portion of the organic light-emitting layer OL may be integrally formed over a plurality of first electrodes EL1. Alternatively, the organic light-emitting layer OL may be individually provided corresponding to each of the plurality of first electrodes EL1.

The second electrode EL2 is provided on the organic light-emitting layer OL. The second electrode EL2 may be provided for each pixel PXL. Alternatively, the second electrode EL2 may be provided to cover most of the display area DA and be shared by the plurality of pixels PXL.

The second electrode EL2 may be used as either an anode or a cathode. When the first electrode EL1 is an anode, the second electrode EL2 may be used as a cathode. When the first electrode EL1 is a cathode, the second electrode EL2 may be used as an anode.

The second electrode EL2 may be formed of a metal layer, made of Ag, Mg, Al, Pt, Pd, Au, Ni, Nd, Ir, Cr, or the like, and/or a transparent conductive layer made of ITO (indium tin oxide), IZO (indium zinc oxide), ZnO (zinc oxide), ITZO (indium tin zinc oxide), or the like. The second electrode EL2 may be formed of a multilayer structure having two or more layers including a thin metal layer. For example, the second electrode EL2 may be formed of a triple-layer structure comprising ITO/Ag/ITO.

The second electrode EL2 may be formed of a metal reflective layer and/or a transparent conductive layer when it is desired to provide an image in a direction toward the lower portion of the substrate SUB, and may be formed of a transparent conductive layer when it is desired to provide an image in a direction toward the upper portion of the substrate SUB.

The encapsulation layer SL is provided on the second electrode EL2. The encapsulation layer SL may be formed of a single layer or multiple layers. The encapsulation layer SL may include first to third encapsulation layers SL1 to SL3. The first to third encapsulation layers SL1 to SL3 may be made of an organic material and/or an inorganic material. Disposed at the outermost position, the third encapsulation layer SL3 may be made of an inorganic material.

Hereinbelow, the non-display area NDA will be described. In the following description of the non-display area NDA, explanation of the same elements as that mentioned above will be omitted or simplified to avoid redundancy of explanation.

The line part LP is provided in the non-display area NDA. The non-display area NDA has therein the bent area BA at which the substrate SUB is bent.

The line part LP includes the data lines DL and couples the drive unit and the pixels PXL.

The data lines DL may couple the pixels PXL and the drive unit. To achieve this, the data lines DL may extend from the pixels PXL generally in the second direction DR2. The data lines DL may extend to an end of the additional area ADA with respect to the second direction DR2. Contact electrodes CTE may be provided on ends of the data lines DL. The pixels PXL may be coupled, through the contact electrodes CTE, to the drive unit that is embodied in a chip-on-film form or the like.

The data lines DL may include a plurality of sub-lines coupled to each other. FIG. 3 is simplified for clarity in that only a fan-out line DLb, a link line DLc and a coupling line DLd of the data lines DL are illustrated.

The buffer layer BF is provided on the non-display area NDA of the substrate SUB.

The first to fourth passivation layers PSV1 to PSV4 are successively provided on the buffer layer BF.

A third opening OPN3 is formed in the insulating layers provided in the bent area BA. The bent area BA is an area at which the substrate SUB is bent. In other words, the third opening OPN3 may be formed in the buffer layer BF, the first passivation layer PSV1, the second passivation layer PSV2 and the third passivation layer PSV3 by removing portions thereof corresponding to the bent area BA. In some of the buffer layer BF, the first passivation layer PSV1, the second passivation layer PSV2 and the third passivation layer PSV3, portions thereof corresponding to the bent area BA might not be removed. For example, in the buffer layer BF, a portion thereof corresponding to the bent area BA might not be removed, and the other insulating layers, that is, the first passivation layer PSV1, the second passivation layer PSV2 and the third passivation layer PSV3, may be formed such that portions thereof corresponding to the bent area BA are removed to form the third opening OPN3.

The phrase "the third opening OPN3 corresponds to the bent area BA" may refer to the third opening OPN3 overlapping the bent area BA. The area of the opening OPN may be greater than that of the bent area BA. The width of the third opening OPN3 is illustrated as being larger than that of the bent area BA. However, the width of the third opening OPN3 may be the same as that of the bent area BA or otherwise different from the illustrated width.

For reference, although, in FIG. 3, inner side surfaces of the buffer layer BF, the first passivation layer PSV1, the second passivation layer PSV2, and the third passivation layer PSV3 have been illustrated as being aligned with each other and disposed on a linear line, they may have other configurations. For example, the third opening OPN3 of the third passivation layer PSV3 may have an area greater than that of the third opening OPN3 of the buffer layer BF. The third opening OPN3 of the buffer BF may be defined as having the smallest area among the third opening OPN3 of the first passivation layer PSV1, the third opening OPN3 of the second passivation layer PSV2, and the third opening OPN3 of the third passivation layer PSV3.

A bent-part insulating layer INS_B is provided in the third opening OPN3. At least a portion of the third opening OPN3 is filled with the bent-part insulating layer INS_B. In FIG. 3 there is illustrated an example in which the third opening OPN3 is completely filled with the bent-part insulating layer INS_B. The bent-part insulating layer INS_B may fill the third opening OPN3 and, simultaneously, cover a portion of an upper surface of the third passivation layer PSV3 corresponding to an area adjacent to the third opening OPN3, e.g., the first and/or second flat areas FA1 and FA2.

The bent-part insulating layer INS_B may be an organic insulating layer made of an organic material. An organic insulating material such as a polyacryl-based compound, a polyimide-based compound, a fluorocarbon compound such as Teflon, or a benzocyclobutene compound may be used as the organic material.

Although FIG. 3 depicts the display device in an unbent state, the display device may be bent in the bent area BA. The display device may be manufactured in a flat shape and then bent later.

The bent area BA has been illustrated as being disposed within a portion from which the inorganic insulating layers have been removed. However, the bent area BA may match the portion from which the inorganic insulating layers have been removed. For example, although the bent area BA generally corresponds to the portion from which the inorganic insulating layers have been removed, the bent area BA may be equal to, or wider, or narrower, than the portion from which the inorganic insulating layers have been removed. Furthermore, the bent area BA has been illustrated as being disposed on only the non-display area NDA, but may have other configurations. For example, the bent area BA may be provided over both the non-display area NDA and the display area DA, or may be disposed in the display area DA. The fourth passivation layer PSV4 may be provided on the substrate SUB. The fourth passivation layer PSV4 may be an inorganic insulating layer. In this regard, the fourth passivation layer PSV4 is not formed in a region corresponding to the bent area BA, in the same manner as that of the above-mentioned inorganic insulating layers (the buffer layer BF, the first passivation layer PSV1, the second passivation layer PSV2, and/or the third passivation layer PSV3). In addition, the fourth passivation layer PSV4 exposes a portion of an upper surface of a lower contact electrode CTEa.

The lower contact electrode CTEa may be provided on the third passivation layer PSV3. An upper contact electrode CTEb may be provided on the lower contact electrode CTEa. The upper contact electrode CTEb may be formed using the same material as that of a connection pattern CNP of the display area DA through the same process. The lower contact electrode CTEa and the upper contact electrode CTEb constitute the contact electrodes CTE. The lines may be coupled, through the contact electrodes CTE, to the drive unit that is embodied in a chip-on-film or flexible printed circuit board form, or the like.

Figure 4:
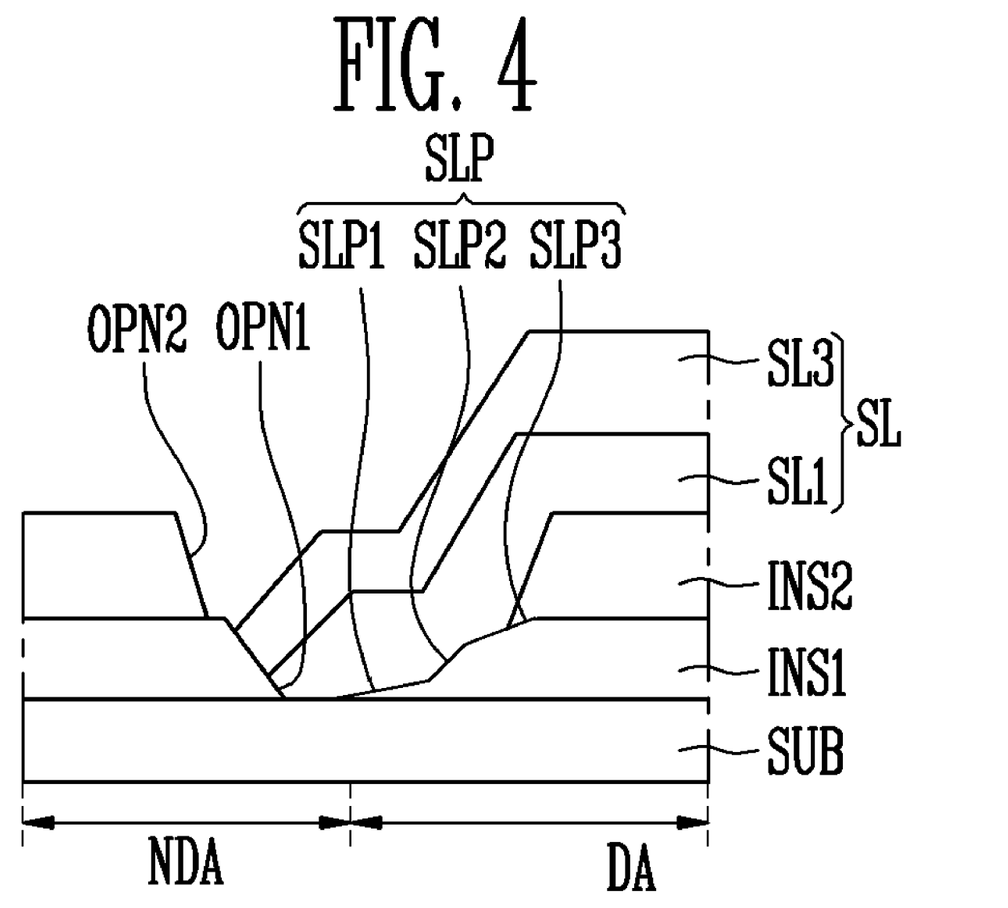
FIG. 4 is an enlarged cross-sectional view of a portion of FIG. 3 illustrating a first embodiment of the first opening in more detail.

To more clearly illustrate the shape of the first insulating layer and the second insulating layer and the openings formed therein, some elements are not shown in FIG. 4. The display device is not limited to the configuration shown in FIG. 4. Therefore, the display device may further include other elements in addition to the elements shown in FIG. 4.

Referring to FIG. 4, the first insulating layer INS1, the second insulating layer INS2 and the encapsulation layer SL are successively stacked on the substrate SUB.

With regard to the slopes SLP for preventing a vortex of etchant, the first slope SLP1 may have a first inclination, and the second slope SLP2 may have a second inclination different from the first inclination. In addition, the third slope SLP3 may have a third inclination different from the second inclination. The first inclination and the third inclination may be same or differ from each other. The second inclination may have an angle greater than that of the first inclination or the third inclination. When the first inclination and the third inclination satisfies any of the foregoing relationships, silver (Ag) particles may be reduced or prevented from being deposited on one side of the first opening OPN1.

The number of different slopes SLP and the inclination of each slope SLP is not limited to the above-described example. Therefore, the slopes SLP may include two, four or more slopes as well as the three slopes in the examples described above. The inclinations of the slopes SLP may be all different, or some of them may be the same. In addition, the slopes SLP may be provided on one of opposite sides of the first opening OPN1, or on both sides thereof. Therefore, the slopes SLP may be provided on a side of the first opening OPN1 that is adjacent to the non-display area NDA, or on both sides of the first opening OPN1. Those skilled in the art may understand that various changes in the number, inclinations and positions of slopes SLP are possible so long as the effects of preventing a vortex of etchant and preventing silver (Ag) particles from being deposited can be achieved.

The slopes SLP may be formed by controlling an etching rate. For example, the respective slopes SLP1, SLP2 and SLP3 illustrated in FIG. 4 may be formed using a difference in etching rate between corresponding portions of the first insulating layer INS1. To vary the etching rate, a half-tone mask may be used or a plurality of masks may be used. The method of varying the etching rate to achieve the variable slopes SLP is not limited to the above description, but may also include any other method known in the art to produce variable sloped surfaces.

The second insulating layer INS2 is provided on the first insulating layer INS1. Referring to FIG. 4, the second insulating layer INS2 covers only a portion of the third slope SLP3. However, the second insulating layer INS2 may cover all of the slopes SLP as will be described below.

The encapsulation layer SL is provided on the second insulating layer INS2. The encapsulation layer SL may include a first encapsulation layer SL1, a second encapsulation layer SL2, and a third encapsulation layer SL3. The first encapsulation layer SL1 and the third encapsulation layer SL3 may be respectively a first inorganic insulating layer and a second inorganic insulating layer. The second encapsulation layer SL2 may be an organic insulating layer. Consequently, the encapsulation layer SL may have a structure in which the first inorganic insulating layer, the organic insulating layer, and the second inorganic insulating layer are successively stacked. However, the structure of the encapsulation layer SL may be something else as well. Therefore, those skilled in the art may understand that the number or materials of encapsulation layers SL may vary or be adjusted as desired by the skilled artisan.

The first encapsulation layer SL1 may be made of an inorganic material, the second encapsulation layer SL2 may be made of an organic material or an inorganic material, and the third encapsulation layer SL3 may be made of an inorganic material. In the case of an inorganic material, the resistance to penetration of water or oxygen is higher than that of an organic material, but the inorganic material is prone to crack because it has lower flexibility than an organic material. Since the first encapsulation layer SL1 and the third encapsulation layer SL3 are made of an inorganic material, and the second encapsulation layer SL2 is made of an organic material, the spread of cracks may be reduced or prevented. In the case where the second encapsulation layer SL2 is made of organic material, it may be fully covered with the third encapsulation layer SL3 so that an edge of the second encapsulation layer SL2 is prevented from being exposed to the outside.

Organic insulating material such as a polyacryl-based compound, a polyimide-based compound, a fluorocarbon compound such as Teflon, or a benzocyclobutene compound may be used as the organic material. Polysiloxane, silicon nitride, silicon oxide, silicon oxynitride, or the like may be used as the inorganic material. In the case where the second encapsulation layer SL2 is made of an inorganic material in lieu of an organic material, various silicon-based insulating materials, for example, hexamethyldisiloxane (HMDSO), octamethylcyclotetrasiloxane (OMCTSO), tetramethyldisiloxane (TMDSO), tetraethyleorthosilicate (TEOS), and so on, may be used. The encapsulation layer SL may cover and protect organic light-emitting layers that are prone to damage by water or oxygen. The encapsulation layer SL may cover the display area DA and extend beyond the display area DA.

However, in the case of the insulating layers made of an organic material, there are advantages in aspects of flexibility, elasticity, and so on, but they are prone to penetration of water or oxygen compared to that of the insulation layer made of inorganic material. To prevent water or oxygen from penetrating into the insulating layers made of an organic material, the insulating layers made of an organic material may be covered with the insulating layers made of an inorganic material such that edges of the insulating layers made of organic material are not exposed to the outside. For example, the first insulating layer INS1 and the second insulating layer INS2 that are made of the organic material may extend to only a boundary between the display area DA and the non-display area NDA, and edges thereof may be covered with the first encapsulation layer SL1 and/or the third encapsulation layer SL3 that are made of an inorganic material.

Figure 5:
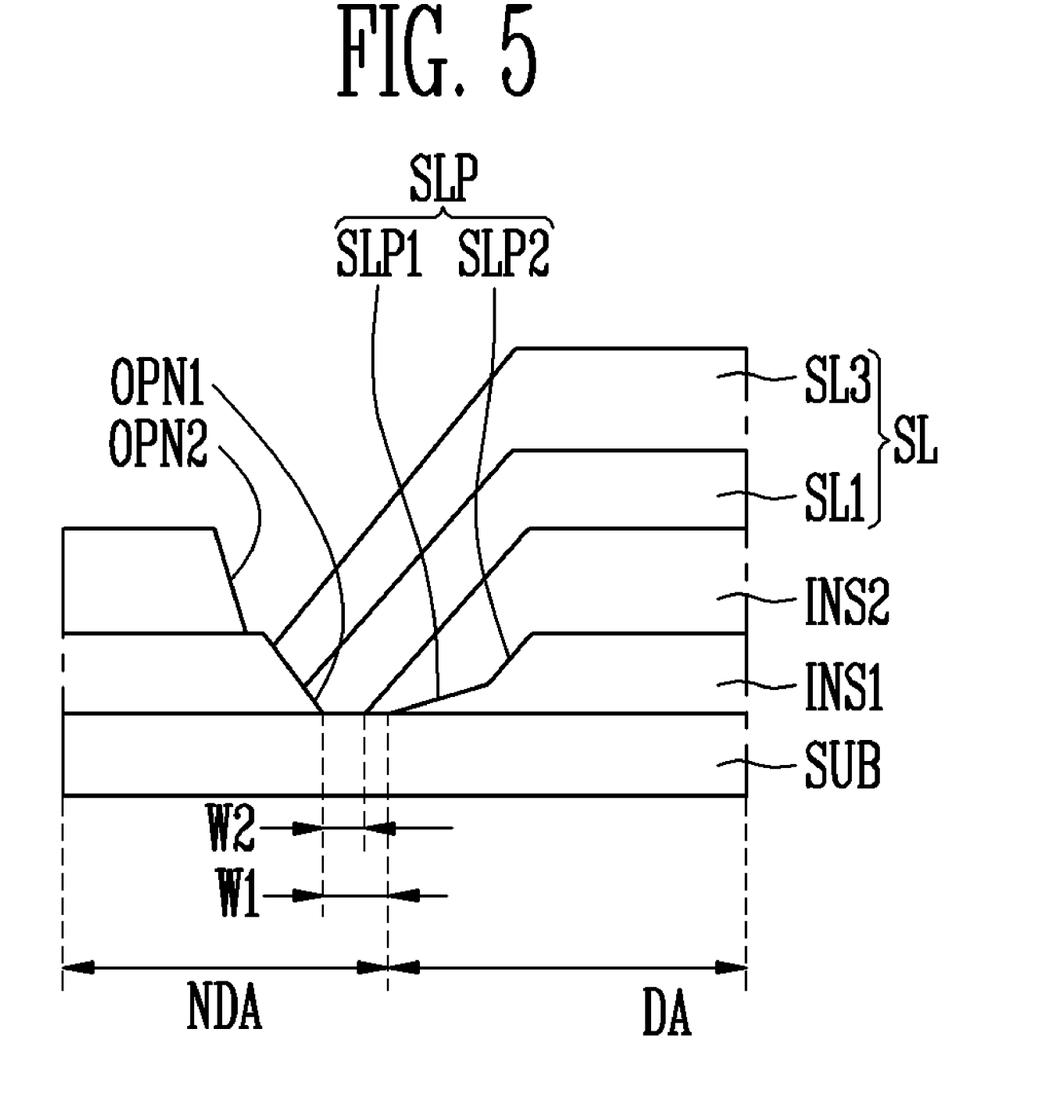
FIG. 5 is an enlarged cross-sectional view of a portion of FIG. 3 illustrating a second embodiment of the first opening.

Referring to the embodiment of FIG. 5, the slopes SLP include a first slope SLP1 and a second slope SLP2, and are provided on a side of the display area DA of the first opening OPN1. The second insulating layer INS2 is provided on the first insulating layer INS1, and covers the slopes SLP. Since the second insulating layer INS2 covers the slopes SLP of the first insulating layer INS1, metal particles deposited on the side of the first opening OPN1 do not make direct contact with the encapsulation layer SL. As a result, in this case, although the metal particles are deposited on the side of the first opening OPN1 by a vortex of etchant, the metal particles do not damage the encapsulation layer SL. The above metal particle can be silver particle.

As shown in FIG. 5, in the case where the second insulating layer INS2 covers the slopes SLP, the width of the second opening OPN2 may be less than that of the first opening OPN1. In an area which makes contact with the substrate SUB, a distance W2 between the first insulating layer INS1 and the second insulating layer INS2 is less than a distance W1 between two parts of the first insulating layer INS1. The difference (W1–W2) between the distance W1 between the two parts of the first insulating layer INS1 and the distance W2 between the first insulating layer INS1 and the second insulating layer INS2 may be within a range in which metal particles deposited on the side of the first opening OPN1 do not damage to the encapsulating layer SL.

In the case where the slopes SLP are provided on a non-display area NDA side of the first opening OPN1, the second insulating layer INS2 that is present in the non-display area NDA may cover the slopes SLP. Furthermore, in the case where the slopes SLP are provided on both of opposite sides of the first opening OPN1, the second insulating layers INS2 disposed on opposite sides of the second opening OPN2 may respectively cover the slopes SLP provided in the display area DA and the slopes SLP provided in the non-display area NDA. Here, the second insulating layers INS2 that cover the slopes SLP may be spaced apart from each other by a distance in which water or oxygen do not penetrate the pixels PXL, by a residual layer of the second insulating layer INS2.

Figure 6:
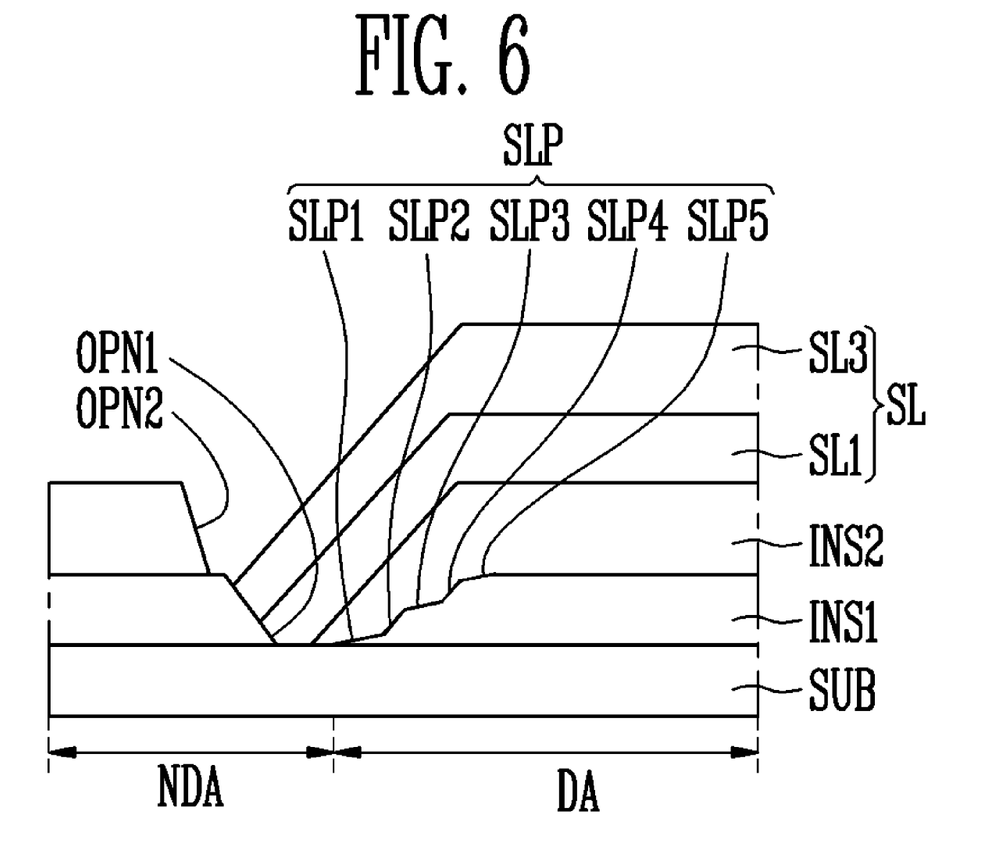
FIG. 6 is an enlarged cross-sectional view of a portion of FIG. 3 illustrating a third embodiment of the first opening.

Referring to FIG. 6, the slopes SLP includes a first slope SLP1, a second slope SLP2, a third slope SLP3, a fourth slope SLP4 and a fifth slope SLP5. Inclinations of the respective slopes SLP1, SLP2, SLP3, SLP4 and SLP5 may be all different, or some of them may be the same.

The display devices described herein may be employed in various electronic devices. For instance, the display device may be applied to a television, a notebook computer, a cellular phone, a smartphone, a smartpad, a PMP (portable multimedia player), a PDA (personal digital assistant), a navigation device, various kinds of wearable devices such as a smartwatch, and so on.

Display device constructed according to the principles of the invention are configured such that an encapsulation layer is prevented from being damaged as described above, which results in improved reliability.

Although certain exemplary embodiments and implementations have been described herein, other embodiments and modifications will be apparent from this description.

Accordingly, the inventive concepts are not limited to such embodiments, but rather to the broader scope of the presented claims and various obvious modifications and equivalent arrangements.

What is claimed is:

1. A display device comprising:
a substrate including a display area and a non-display area provided on at least one side of the display area;
at least one pixel provided on the substrate;
a first insulating layer provided on the substrate, and including a first opening at an area adjacent to the display area;
a second insulating layer provided on the first insulating layer, and including a second opening at the area adjacent to the display area; and
an encapsulation layer covering the first opening, the second opening, and a portion of the non-display area, wherein:
the second insulating layer overlaps at least a portion of at least one side of the first opening in the first insulating layer;
the encapsulation layer comprises a first inorganic insulating layer, an organic insulating layer, and a second inorganic insulating layer that are successively stacked;
the first inorganic insulating layer and the second inorganic insulating layer cover the first opening and the second opening;
the non-display area comprises an additional area which protrudes from a portion thereof and the additional area includes a bent area having flexibility; and
the bent area is bendable at a radius of curvature of about 4.5 mm or less.

2. The display device of claim 1, wherein:
the at least one side of the first opening comprises a plurality of slopes having different inclinations; and
the second insulating layer overlaps at least one of the plurality of slopes of the first opening.

3. The display device of claim 1, wherein the first opening and the second opening extend along the boundary between the display area and the non-display area of the substrate.

4. The display device of claim 1, wherein the first insulating layer and the second insulating layer are provided in the bent area.

5. The display device of claim 1, wherein the non-display area is provided along a perimeter of the display area.

6. The display device of claim 1, wherein each of the first insulating layer and the second insulating layer includes organic insulating material.

7. The display device of claim 1, wherein the substrate has flexibility.

8. The display device of claim 1, wherein a width of the second opening is less than a width of the first opening, and a first distance between an edge of the first insulating layer and an edge of the second insulating layer opposite to the edge of the first insulating layer in the first opening is less than the width of the first opening.

9. The display device of claim 8, wherein the first distance is within a range in which metal particles deposited on the at least one side of the first opening do not damage the encapsulating layer.

10. The display device of claim 1, wherein the pixel comprises a first electrode provided on the first insulating layer and a second electrode provided on the second insulating layer, and at least one of the first electrode and the second electrode includes a metal layer.

11. The display device of claim 1, wherein the second insulating layer overlaps a side of the first opening that is adjacent to the display area.

12. A display device comprising:
a substrate including a display area and a non-display area provided on at least one side of the display area;
at least one pixel provided on the substrate;
a first insulating layer provided on the substrate, and including a first opening at an area adjacent to the display area;
a second insulating layer provided on the first insulating layer, and including a second opening at the area adjacent to the display area; and
an encapsulation layer covering the first opening, the second opening, and a portion of the non-display area, wherein:
the second insulating layer overlaps at least a portion of at least one side of the first opening in the first insulating layer;
the at least one side of the first opening comprises a plurality of slopes having different inclinations;
the second insulating layer overlaps at least one of the plurality of slopes of the first opening; and
the at least one side of the first opening comprises a first slope having a first inclination, a second slope having a second inclination different from the first inclination, and a third slope having a third inclination different from the second inclination.

13. The display device of claim 12, wherein the second inclination is greater than the first inclination or the third inclination.

14. The display device of claim 12, wherein the second insulating layer overlaps the first slope, the second slope, and the third slope.

15. A display device comprising:
a substrate including a display area and a non-display area provided on at least one side of the display area;
at least one pixel provided on the substrate;
a first insulating layer provided on the substrate, and including a first opening at an area adjacent to the display area;
a second insulating layer provided on the first insulating layer, and including a second opening at the area adjacent to the display area; and
an encapsulation layer covering the first opening, the second opening, and a portion of the non-display area, wherein:
the second insulating layer overlaps at least a portion of at least one side of the first opening in the first insulating layer;
an area of the second insulating layer is less than an area of the first insulating layer;
the encapsulation layer comprises a first inorganic insulating layer, an organic insulating layer, and a second inorganic insulating layer that are successively stacked;
the first inorganic insulting layer and the second inorganic insulating layer cover the first opening and the second opening;
the non-display area comprises an additional area which protrudes from a portion thereof and the additional area includes a bent area having flexibility; and
the bent area is bendable at a radius of curvature of about 4.5 mm or less.

16. The display device of claim 15, wherein:
the at least one side of the first opening comprises a plurality of slopes having different inclinations; and the second insulating layer overlaps at least one of the plurality of slopes of the first opening.

17. The display device of claim 15, wherein the second insulating layer overlaps a side of the first opening that is adjacent to the display area.

\* \* \* \* \*